United States Patent [19]

Cunningham et al.

[11] 3,921,282

[45] Nov. 25, 1975

[54] INSULATED GATE FIELD EFFECT TRANSISTOR CIRCUITS AND THEIR METHOD OF FABRICATION

[75] Inventors: James A. Cunningham; Robert H. Wakefield, Jr.; Mark R. Guidry, Jr., all of Houston, Tex.

[73] Assignee: Texas Instruments Incorporated, Dallas, Tex.

[22] Filed: Feb. 16, 1971

[21] Appl. No.: 115,428

[52] U.S. Cl. ........................ 29/571; 29/577; 357/41

[51] Int. Cl.$^2$ ........................ B01J 17/00

[58] Field of Search .............. 29/571, 577, 578, 589

[56] References Cited

UNITED STATES PATENTS

| | | | |
|---|---|---|---|
| 3,484,932 | 12/1969 | Cook | 29/577 |
| 3,501,681 | 3/1970 | Weir | 29/589 X |
| 3,508,325 | 4/1970 | Perry | 29/578 X |
| 3,535,775 | 10/1970 | Garfinkel et al. | 29/589 X |
| 3,570,114 | 3/1971 | Bean et al. | 29/625 |
| 3,576,478 | 4/1971 | Watkins et al. | 317/235 |
| 3,676,921 | 7/1972 | Kooi | 29/571 |

*Primary Examiner*—W. Tupman
*Attorney, Agent, or Firm*—Harold Levine; Edward J. Connors, Jr.; John G. Graham

[57] ABSTRACT

Insulated gate field effect transistor circuits utilizing transistors having a self-aligned gate, reduced parasitic capacitance and lower surface step-heights are fabricated with three levels of interconnects. The self-aligned gate transistors are fabricated with the use of a silicon nitride diffusion mask which also serves as an oxidation barrier in the formation of a thick oxide over the source and drain regions. Diffused interconnects are formed simultaneously with the source and drain region diffusions. The silicon nitride is then replaced with a more suitable dielectric, followed by the formation of polycrystalline silicon interconnects to provide source, drain and gate electrodes, and to provide a second level of interconnects which cross over the diffused interconnects at desired locations. An insulating layer is formed over the silicon interconnects and a metallization interconnect pattern, which crosses over the silicon interconnects at various desired locations is then formed to complete the circuit.

2 Claims, 11 Drawing Figures

INVENTORS
JAMES A. CUNNINGHAM
ROBERT H. WAKEFIELD, JR.
MARK R. GUIDRY, JR.
BY Stephen Sadacca
ATTORNEY

INSULATED GATE FIELD EFFECT TRANSISTOR CIRCUITS AND THEIR METHOD OF FABRICATION

This invention relates to the fabrication of semiconductor circuits, and more particularly to the processing of semiconductor wafers to achieve self-aligned insulated gate field effect transistors and three levels of interconnects which cross over each other at selected locations on the wafer surface. In a specific embodiment, the insulated gate field effect transistors and diffused interconnects are fabricated with the use of a silicon nitride diffusion mask so that polycrystalline silicon source, drain and gate electrodes, and interconnects are then formed which may cross over the diffused interconnects at desired locations and a metallization level of interconnects is formed over the polycrystalline silicon electrodes and interconnects and insulated therefrom to cross over the silicon interconnects at desired locations.

In the formation of an insulated field effect transistor circuit, a primary concern is to obtain a precise alignment of the gate dielectric and the gate electrode with the gate regions of the semiconductor body. Any misalignment is costly, since the resulting asymmetry adversely effects the device reliability and can sharply reduce the yield of devices which meet design characteristics. If the gate dielectric and gate electrode structure overlap the source and drain areas, a parasitic capacitance is introduced, which seriously limits the frequency range of the device. Increased insulator thickness adjacent the gate dielectric does tend to reduce the capacitance; however, the increased step heights thereby introduced on the surface of the slice can severely reduce yields obtained during the subsequent formation of interconnects. Recent developments have included various techniques for self-alignment of the gate structure. In one such process, a polycrystalline silicon gate electrode is first formed over the gate dielectric. The source, drain and diffused interconnect regions are then formed utilizing the polycrystalline silicon as a diffusion mask. Since the silicon gate and interconnects are formed first, they cannot cross over any of the diffusions. A metallization pattern must then be formed over the diffused and polycrystalline interconnects so that a limited number of crossover connections can be made.

In copending patent application Ser. No. 074,652 filed Sept. 23, 1970 and assigned to the assignee of the present invention is described a method of fabricating self-aligned gate field effect transistors with the use of a silicon nitride diffusion mask which also serves as an oxidation barrier in the formation of a thick oxide over the source and drain regions. The present invention including a technique of forming complex field effect transistor circuits and systems, with three levels of interconnects which are capable of crossing over each other, is an improvement of that process.

Accordingly, it is an object of the present invention to provide improved techniques for use in processing semiconductor wafers. More particularly, it is an object of the invention to provide a method having specific utility in the fabrication of insulating gate field effect transistor circuits and systems.

It is a further object of the invention to provide a method of fabricating complex insulated gate field effect transistor circuits and systems. Still another object of the invention is to increase the packing density of insulated gate field effect transistor integrated circuits and systems by a factor of 30%. It is also an object of the invention to provide field effect transistor integrated circuits and systems with reduced overlap capacitance, increased frequency ranges, lower threshold voltages, and three levels of interconnects which are capable of crossing over each other at any desired locations.

These and other objects are accomplished in accordance with the features of the invention. One feature of the invention is that a silicon nitride diffusion mask is utilized to form the source and drain regions which allows the gate to be self aligned and hence reduces parasitic or overlap capacitance and increases the frequency range of the field effect transistors.

Another feature of the invention is that diffused interconnects are formed at the same time the source and drain regions are formed reducing the number of processing steps and providing a first level of circuit or system interconnects. A further feature of the invention is that polycrystalline silicon is utilized as a gate electrode, which reduces the threshold voltages of the field effect transistors.

Still another feature of the invention is that polycrystalline silicon interconnects and the gate electrodes are formed simultaneously after the diffused source, drain and interconnect regions have been formed again reducing the number of processing steps and providing a second level of interconnects which may cross over or connect to the diffused regions at any desired locations. Yet a further feature of the invention is that a third level of interconnects is provided which may cross over or connect to the diffused and/or silicon interconnects to provide more complex circuits and systems and greater packing densities.

Still further objects, advantages and features of the invention will be apparent from the following detailed description of specific embodiments when read in conjunction with the drawings wherein.

Figure 1:
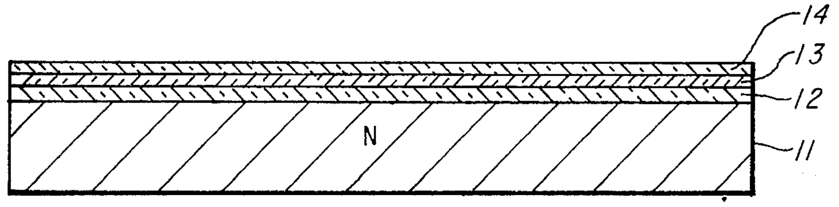
FIGS. 1–8 are enlarged, cross-sectional views of a monocrystalline silicon wafer illustrating various intermediate stages in the fabrication of an insulated gate field-effect transistor circuit in accordance with the invention.

As shown in FIG. 1, the process begins with the selection of a monocrystalline silicon wafer, or slice, 11 of one conductivity type. For example, silicon wafer 11 having n-type conductivity is provided by doping with phosphorous or antimony to a resistivity generally in the range of 1–10 ohms centimeters. Wafer 11 is next cleaned with hydrofluoric acid (HF), then rinsed in water, then cleaned with nitride acid ($HNO_3$) and again rinsed with water. Wafer 11 is next provided with an initial clean gate insulating layer 12. For example, gate oxide layer 12 is grown to a thickness of 1200 angstroms by placing wafer 11 in an oxygen ($O_2$) atmosphere for 22 minutes and then for 30 minutes in a nitrogen ($N_2$) atmosphere both at 1200°C. Wafer 11 is then provided with silicon nitride ($Si_3N_4$) layer 13, using known techniques. For example, layer 13 is deposited to a thickness of 300 to 1000 angstroms by preheating wafer 11 for 5 minutes, depositing the silicon nitride by the reaction of silane with ammonia for 7 minutes, and then drying for an additional 5 minutes, all at a temperature of 700°–1000° C., and preferably at 900° C.

Layer 14 of silane ($SiO_2$) is next deposited to a thickness of 5000 angstroms for utilization as an etch mask. The silane is deposited at 400°C. The silicon nitride coated wafer could alternately have been placed in a steam oxidation furnace at a temperature of 1100°–1300° C., preferably 1150°–1250° C., for 5 to 20 minutes until a sufficient thickness of the silicon nitride surface is converted to silicon oxide for use as the etch mask. Or, a molybdenum layer could also have been formed as the etch mask for the nitride etch. Silane layer 14 is then cleaned to remove any silane dust.

In a preferred embodiment, the silane is next densified by preheating wafer 11 to about 900° C. for approximately 5 minutes, treating the wafer with steam for approximately 15 minutes at about 900° C. and then exposing the wafer to oxygen at about 900° C. for approximately 5 minutes.

Figure 2:
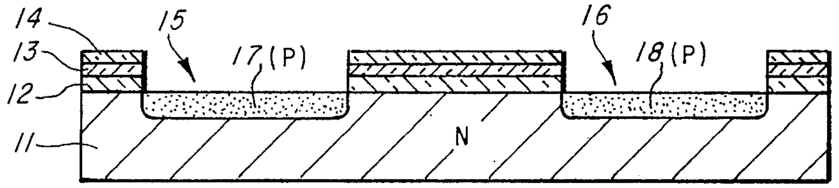

The silane etch mask is next formed for selective etching of nitride layer 13. The oxide is patterned by photolithographic techniques and portions thereof selectively removed with hydrofluoric acid. The underlying portions of nitride layer 13 are removed with hot phosphoric acid ($H_3PO_4$) at about 185° C. and the underlying portions of oxide layer 12 are removed with hydrofluoric acid to provide windows 15 and 16 as shown in FIG. 2.

The masked wafer is then processed through a deposition cycle of opposite conductivity type such as a p-type boron deposition cycle at a temperature of 1000°–1200° C. and preferably about 1050°C. Wafer 11 is first preheated for 5 minutes, a boron deposition ($BBr_3$) is then performed for about 25 minutes and finally an oxygen drive is performed for 25 minutes all at the 1050° C. temperature to form the source 17, drain 18 and diffused interconnect regions with a final sheet resistance of about 10–150 ohms per square, preferably about 25–30 ohms per square, as illustrated in FIG. 2.

Figure 3:
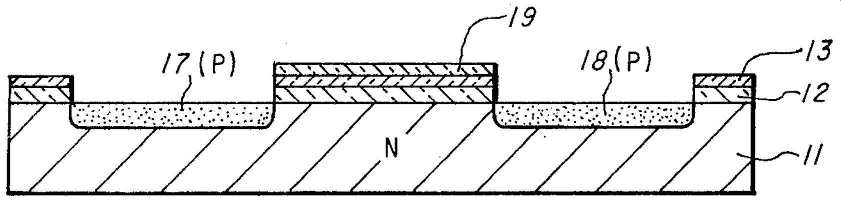
Figure 4:
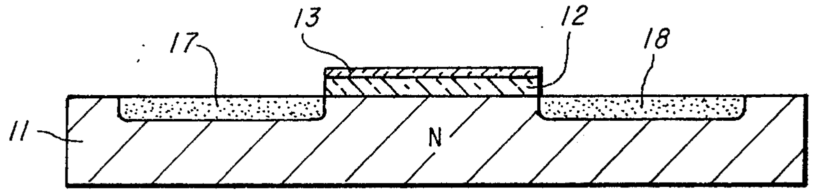
Figure 5:
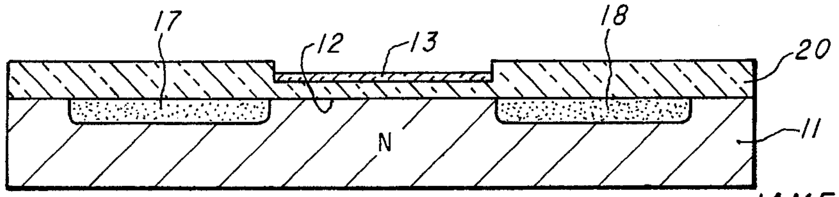

As illustrated in FIG. 3, the silane etch mask is next removed with hydrofluoric acid and another silane etch mask 19 deposited to about 3000 angstroms at approximately 400°C. The wafer is again cleaned and portions of nitride layer 13 are removed by hot phosphoric acid at 185°C. utilizing oxide layer 19 as a mask as illustrated in FIG. 4. Portions of gate oxide 12 are removed with hydrofluoric acid, utilizing remaining portions of nitride layer 13 as a mask. As illustrated in FIG. 5, the wafer is again cleaned and a thick oxide layer 20 of about 15,000 angstroms is formed by heating wafer 11 in an oxidation chamber at about 900°C. for approximately 5 minutes, heating wafer 11 in steam for approximately 960 minutes at 900°C., and finally again heating wafer 11 in an oxygen atmosphere for approximately 5 minutes at about 900°C. The remaining silicon nitride layer 13 acts as an oxidation barrier in growing the thick oxide.

Where capacitors are to be formed, oxide layer 20 is removed down to a diffused area so that a thin oxide capacitor can be formed. The oxide is removed with hydrofluoric acid. The wafer is again cleaned and a gate or thin oxide capacitor oxidation is performed at about 950°C. by placing the wafer in an oxidation atmosphere for approximately 5 minutes, exposing the wafer to steam for approximately 16 minutes and then exposing the wafer to nitrogen for an additional 60 minutes, approximately. In this manner, a clean gate oxide ($SiO_2$) layer is formed to about 1200 angstroms for the capacitors.

Figure 6:
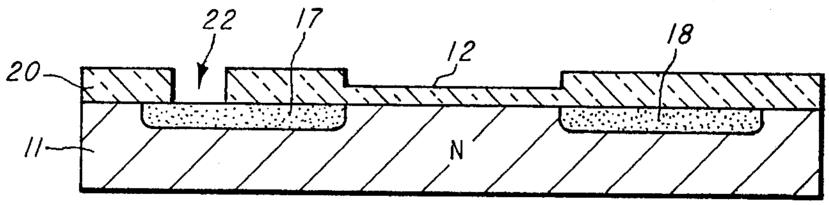

As illustrated in FIG. 6, the thick oxide layer is also etched with hydrofluoric acid to form windows 22 exposing portions of the source, drain and diffused interconnect regions so that polycrystalline silicon electrodes and interconnects can be ohmically connected to desired diffused regions. The wafer is again cleaned and all of the remaining silicon nitride ($Si_3N_4$) 13 is removed with hot phosphoric acid ($H_3PO_4$).

Figure 7:
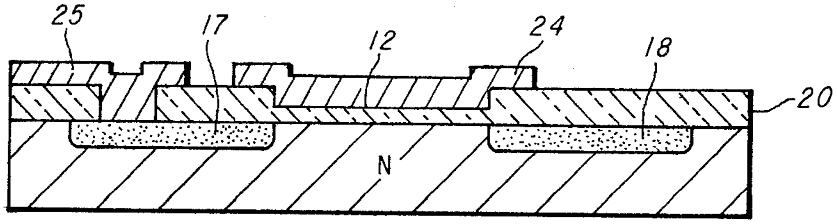

Then, in accordance with the invention, polycrystalline silicon is deposited by exposing wafer 11 to a nitrogen atmosphere for about 5 minutes, depositing the polycrystalline silicon 23 for about 15 minutes and then exposing the wafer into a nitrogen atmosphere for an additional about, 5 minutes. The silicon is deposited from the reaction of $SiH_4$ and $H_2$. As illustrated in FIG. 7, silicon layer 23 is selectively etched to form the source, drain and gate electrodes and the second level of polycrystalline silicon interconnects as desired. For example, in the embodiment illustrated in FIG. 7, gate electrode 24 and source electrode 25 are shown. The polycrystalline silicon interconnects which are formed over oxide layer can cross over source, drain and diffused interconnect regions at any selected locations as they are insulated by layer 20. The polycrystalline silicon etch is performed by a solution of 45% nitric acid ($HNO_3$)/5% hydrofluoric acid (HF)/50% acetic acid (HAC). The wafer is again cleaned and the polycrystalline silicon is doped to form boron glass on the silicon electrodes. The boron deposition is performed at about 975°C. by exposing the wafer to an oxygen atmosphere for 5 minutes, depositing boron ($BBr_3$) for 20 minutes, and again exposing the wafer to an oxygen atmosphere for 5 minutes.

Figure 8:
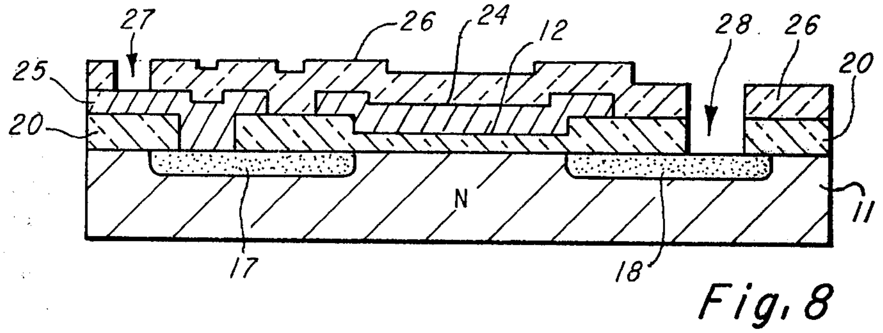

Next, as illustrated in FIG. 8, a 7000 A layer 26 of silane ($SiO_2$) is deposited at about 400° C. The wafer is again cleaned and silane layer 26 is densified and pinhole sealed by a phosphorus glass layer. This is accomplished by placing the wafer in oxygen atmosphere for approximately 5 minutes at 900° C. exposing the wafer to $POCl_3$ for 2 minutes at 900°C. and then exposing the wafer to dry oxygen at 900° C. Windows, for example 27 and 28, are then etched in the silane and underlying oxide layers for connection of the third level of interconnect material to either the polysilicon interconnects or substrate diffused regions. The oxide is removed with hydrofluoric acid after masking with ordinary photolithographic techniques.

Figure 9:
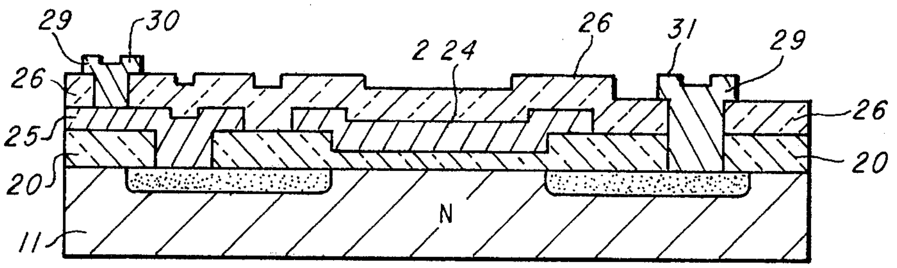
FIG. 9 is an enlarged, cross-sectional view of a portion of the circuit completed in accordance with the process of FIGS. 1–8.

As illustrated in FIG. 9, the wafer is again cleaned and an interconnect material 29 such as aluminum, for example, is selectively deposited over silane layer. The metal is then selectively removed to form the third level interconnects, such as 30 and 31. As a final step, the entire wafer is baked in a hydrogen atmosphere at approximately 450° C. for about 30 minutes.

Figure 10:
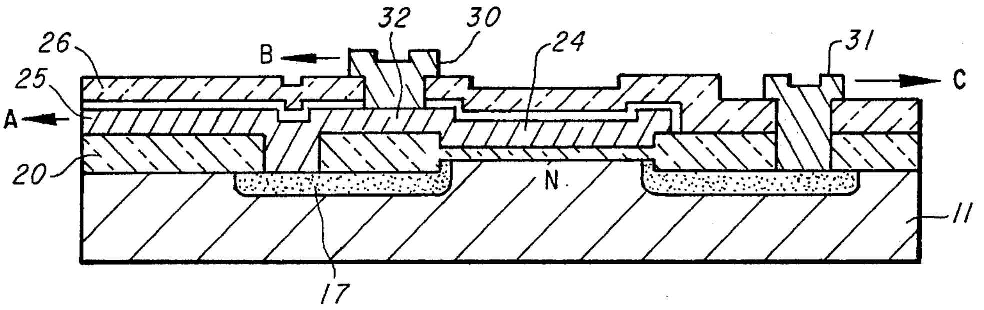
FIG. 10 is an enlarged, cross-sectional view of an embodiment of a portion of a circuit in which a gate shorted to source or drain region is fabricated as a resistor.

Illustrated in FIG. 10 is another embodiment fabricated in accordance with the invention. In this embodiment polycrystalline silicon gate electrode 24 is fabricated continuous with electrode 25 by interconnect portion 32. Since silicon gate electrode 24 is formed after region 17 has been diffused interconnect 32 is capable of crossing over region 17 to form the polycrystalline silicon interconnect, thereby providing a field-effect resistor. Notice that electrode 25, 30 and 31 can be connected to various other components of an integrated circuit in almost any direction to provide terminals A, B and C.

Figure 11:
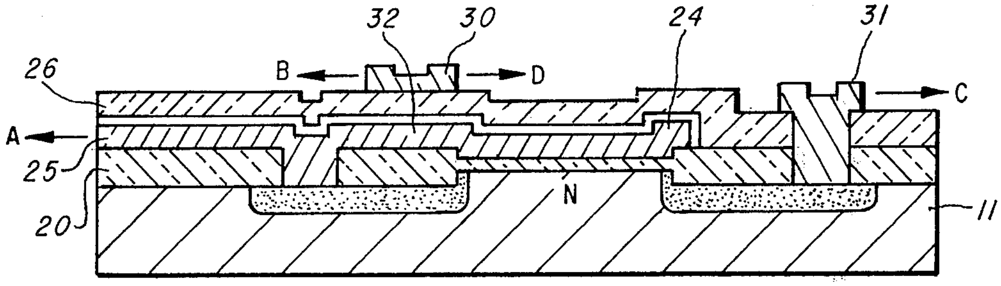
FIG. 11 is an enlarged, cross-sectional view of an embodiment of a portion of a circuit in which a third-level interconnect is shown crossing over a second level interconnect and insulated therefrom.

The embodiment of FIG. 11 is similar to the embodiment of FIG. 10, however, in this embodiment third-level aluminum interconnect 30 is not connected to silicon interconnect 32. It does, however, cross over interconnect 32 and is insulated therefrom by insulating layer 26. Silicon interconnect 25 is connected to various circuit points from terminal A. Aluminum interconnect 31 is connected to various circuit points from terminal C and aluminum interconnect 30 connects various circuit points from terminals B and D, for example.

Several embodiments have now been described in detail. It is to be noted, however, that these descriptions of specific embodiments are merely illustrative of the principles underlying the inventive concept. It is contemplated with various modifications of the disclosed embodiment, as well as other embodiments of the invention, will, without departing from the spirit and scope of the invention, be apparent to persons skilled in the art.

We claim:

1. A method of fabricating an insulated gate field effect device circuit comprising the steps of:

a. forming a silicon nitride mask pattern on the surface of a monocrystalline silicon body of one conductivity type;

b. exposing said masked body to a suitable impurity for converting the exposed portions of the silicon surface to the opposite conductivity type for source, drain and doped interconnect regions;

c. exposing the masked body to an oxidizing atmosphere whereby the silicon is selectively oxidized to form a thick oxide layer;

d. removing the mask;

e. again subjecting the body to oxidizing conditions to form a thin oxide film having the same pattern as said mask;

f. selectively forming openings in the thick oxide for source, drain and doped interconnect connections;

g. selectively depositing a layer of polycrystalline silicon on said body to form a gate electrode in combination with source, drain electrodes and/or doped interconnects, a silicon interconnect crossing over at least one of said diffused regions and being insulated therefrom by said thick oxide layer;

h. forming an insulating layer on said body;

i. selectively forming openings in the insulating layer for silicon interconnect connections; and j. selectively forming a plurality of conductive interconnects on said body connecting at least one of said conductive interconnects to one of said silicon interconnects and at least one of said conductive interconnects crossing over one of said doped interconnects or said silicon interconnects and being insulated therefrom by said insulating layer.

2. The method of claim 1 wherein the step of forming conductive interconnects includes connecting at least one of said conductive interconnects to one of said doped regions.

* * * * *